United States Patent [19]
Yonemoto

[11] Patent Number: 5,306,926
[45] Date of Patent: Apr. 26, 1994

[54] CCD SOLID STATE IMAGER

[75] Inventor: Kazuya Yonemoto, Tokyo, Japan

[73] Assignee: Sony Corporation, Tokyo, Japan

[21] Appl. No.: 834,599

[22] Filed: Feb. 12, 1992

[30] Foreign Application Priority Data

Feb. 12, 1991 [JP] Japan .................. 3-018938

[51] Int. Cl.$^5$ ............................. H01L 27/14
[52] U.S. Cl. ..................... 257/432; 257/436; 257/233; 257/294; 250/208.1
[58] Field of Search ............... 257/233, 231, 232, 225, 257/294, 436, 432, 435; 250/204, 208.1

[56] References Cited

U.S. PATENT DOCUMENTS

| | | | |
|---|---|---|---|
| 4,588,261 | 5/1986 | Erhardt | 257/432 |
| 4,694,185 | 9/1987 | Weiss | 257/436 |
| 4,814,848 | 3/1989 | Akimoto et al. | 257/233 |
| 4,901,153 | 2/1990 | Machida et al. | 257/234 |
| 5,118,924 | 6/1992 | Mehra et al. | 257/432 |
| 5,172,206 | 12/1992 | Iizuka | 257/294 |
| 5,225,935 | 7/1993 | Watanabe et al. | 359/619 |

FOREIGN PATENT DOCUMENTS 1-251753  10/1989  Japan ...................... 257/432

OTHER PUBLICATIONS

Abe et al., "A CCD Imager with SiO$_2$ Exmposed Photosenser Arrays", *IEDM*, Dec. 1977, pp. 542-544.

Primary Examiner—Andrew J. James
Assistant Examiner—Courtney A. Bowers
Attorney, Agent, or Firm—Hill, Steadman & Simpson

[57] ABSTRACT

A flattened layer (6) formed between a micro-condenser lens (7) and an Al light-shielding layer (5) is formed as a bilayer and this bilayer is formed by sequentially laminating a first layer (6a) and a second layer (6b) having a refractive index ($N_2$) lower than a refractive index ($N_1$) of the first layer (6a). Therefore, of the incident light converged by the micro-condenser lens (7), a light component shielded by the shoulder portion of the Al light-shielding layer (5) is reduced and a sensitivity increasing effect, which is an effect inherent in the condenser lens, can be demonstrated sufficiently, which can make the CCD solid state imager compact in size and which can improve the image quality.

3 Claims, 3 Drawing Sheets

CCD SOLID STATE IMAGER

BACKGROUND OF THE INVENTION

1. Field of the Invention

The present invention generally relates to solid state imagers such as a charge coupled device (CCD) solid state imagers or the like and, more particularly, to a solid state imager in which a micro-condenser lens is formed on a light sensitive portion.

2. Description of the Prior Art

In a solid state imager such as a CCD solid state imager, when considering the relationship among an electrical charge, noise and an illuminance on an image surface on the CCD, it is known that the influences of noise (shot noise) caused by fluctuations of electrical charges and the dark field noise are increased on the low illuminance side.

In order to reduce the above-mentioned shot noise, it is sufficient to increase the aperture efficiency of the light sensitive portion. However, there is a limit to increasing the above aperture efficiency because the solid state imager has recently been more and more miniaturized. To solve this problem, one such structure for the solid state imager is proposed at present, in which a micro-condenser lens is formed on the light sensitive portion. According to this previously-proposed structure in which the micro-condenser lens is formed on the light sensitive portion, the utilization factor of light can be increased, the sensitivity of the light sensitive portion can be increased and the above-mentioned shot noise can be effectively reduced. For example, Japanese Laid-Open Patent Publications Nos. 60-53073 and 1-10666 describe methods of forming a micro-condenser lens.

FIG. 1 shows an example of a structure of a conventional CCD solid state imager. As shown in FIG. 1, a number of transfer electrodes 23 formed of a polycrystalline silicon layer are selectively formed on a silicon substrate 21 through a gate insulating layer 22 made of $SiO_2$ or the like. An Al light-shielding layer 25 is selectively formed on each of the transfer electrodes 23 through an interlayer 24 and a flattened film 26 made of a resin material is laminated on the whole surface including the Al light-shielding layers 25. Then, a micro-condenser lens 27 is formed on the flattened layer 26. A portion on which the above-mentioned transfer electrode 23 is not formed is provided as a light sensitive portion 28. The Al light-shielding layer 25 is removed on the light sensitive portion 28 and the micro-condenser lens 27 is formed in an opposing relation to the light sensitive portion 28.

There is a limit to which the thickness of the Al light-shielding layer 25 formed on the transfer electrode 23 can be reduced. In addition, since an opening width D of the light sensitive portion 28 is further reduced because the solid state imager is recently more and more miniaturized, an aspect ratio of the thickness of the Al light-shielding film 25 relative to the opening width D of the light sensitive portion 28 tends to increase. Also, since the transfer electrode 23 is formed under the Al light-shielding layer 25, it is frequently observed that the above-mentioned aspect ratio become 1 or more in actual practice. In accordance therewith, a shoulder portion 25a of the Al light-shielding layer 25 on the light sensitive portion 28 protrudes toward the edge of the light sensitive portion 28.

Under this situation, in the conventional CCD solid state imager, the condenser lens 27 is simply formed on the light sensitive portion 28 through the resin (flattened) layer 26 so that, when considering the central portion of the image portion in which a number of pixels (picture elements) are arrayed in a matrix fashion, light beams Lo incident on the apex portion of the condenser lens 27 and on the portion near the apex portion are converged by the condenser lens 27 and thereby are introduced into the light sensitive portion 28, while light beams Le incident on the portion near the circumferential edge of the condenser lens 27 are shielded at the shoulder portion 25a of the Al light-shielding film 25. That is, light components, which are not incident on the light sensitive portion 28, occur and hence a sensitivity increasing effect, which is inherent in the effect of the condenser lens 27, is degraded. This phenomenon frequently occurs in the peripheral portion of the above-mentioned image section so that a peripheral depreciation of light which passes through the camera lens becomes very conspicuous, which unavoidably imposes a limit on making the CCD solid state imager compact in size and on improving the image quality.

OBJECTS AND SUMMARY OF THE INVENTION

Therefore, it is an object of the present invention to provide an improved CCD solid state imager in which the aforesaid shortcomings and disadvantages encountered with the prior art can be eliminated.

More specifically, it is an object of the present invention to provide a CCD solid state imager which can be miniaturized in size.

It is another object of the present invention to provide a CCD solid state imager which improves image quality.

According to an aspect of the present invention, a CCD solid state imager is comprised of a light sensitive portion, a condenser lens formed above the light sensitive portion, and a plurality of layers laminated between the light sensitive portion and the condenser lens, wherein the refractive indexes of the plurality of laminated layers are increased from the condenser lens to the light sensitive portion.

In accordance with the arrangement of the present invention, light incident on the condenser lens is sequentially refracted by the plurality of layers and finally becomes incident substantially vertically on the light sensitive portion on the substrate. As a consequence, of the incident light being converged by the micro-condenser lens, the light component shielded by the shoulder portion of an Al light-shielding layer is reduced and a sensitivity increasing effect, which is an effect inherent in the condenser lens, can be demonstrated sufficiently, which allows the CCD solid state imager to be made compact in size and which can improve the image quality.

The above and other objects, features, and advantages of the present invention will become apparent from the following detailed description of illustrative embodiments thereof to be read in conjunction with the accompanying drawings, in which like reference numerals are used to identify the same or similar parts in the several views.

DESCRIPTION OF THE PREFERRED EMBODIMENTS

The present invention will now be described with reference to FIGS. 2 and 3.

Figure 1:
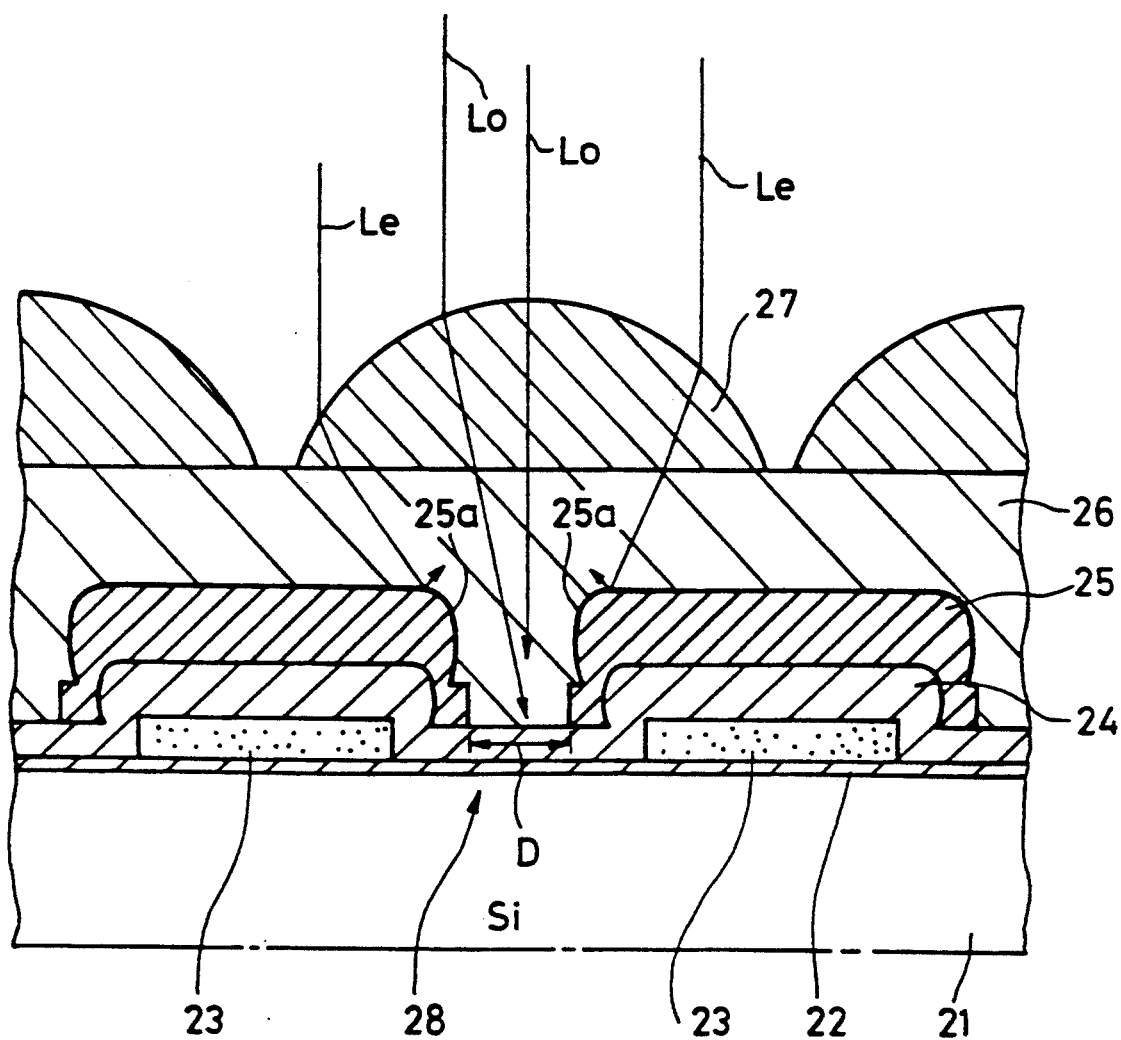
FIG. 1 is a schematic diagram showing a main portion of a CCD solid state imager according to an example of the prior art.
Figure 2:
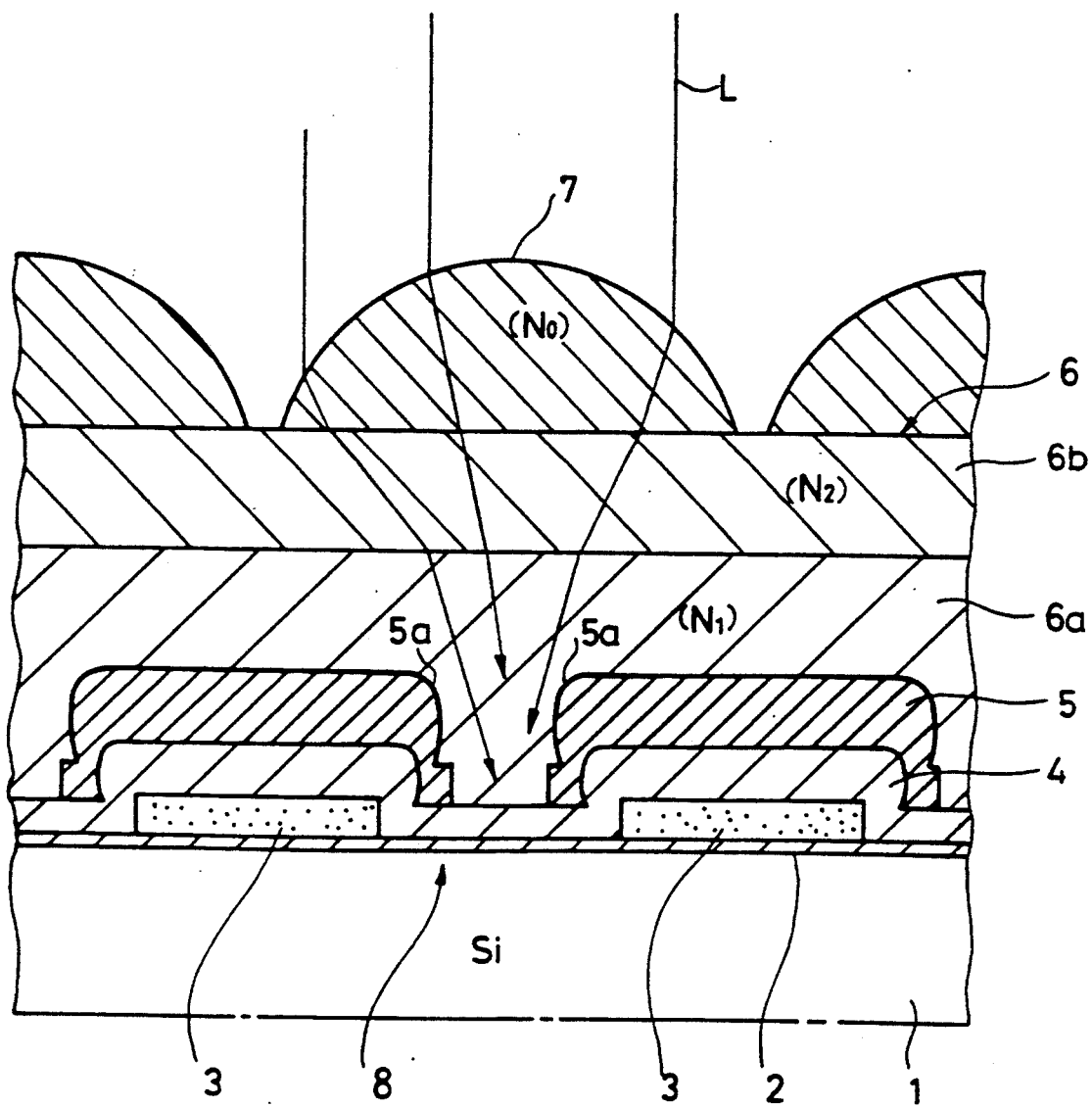
FIG. 2 is a schematic diagram showing a main portion of a first embodiment of a CCD solid state imager according to the present invention.
Figure 3:
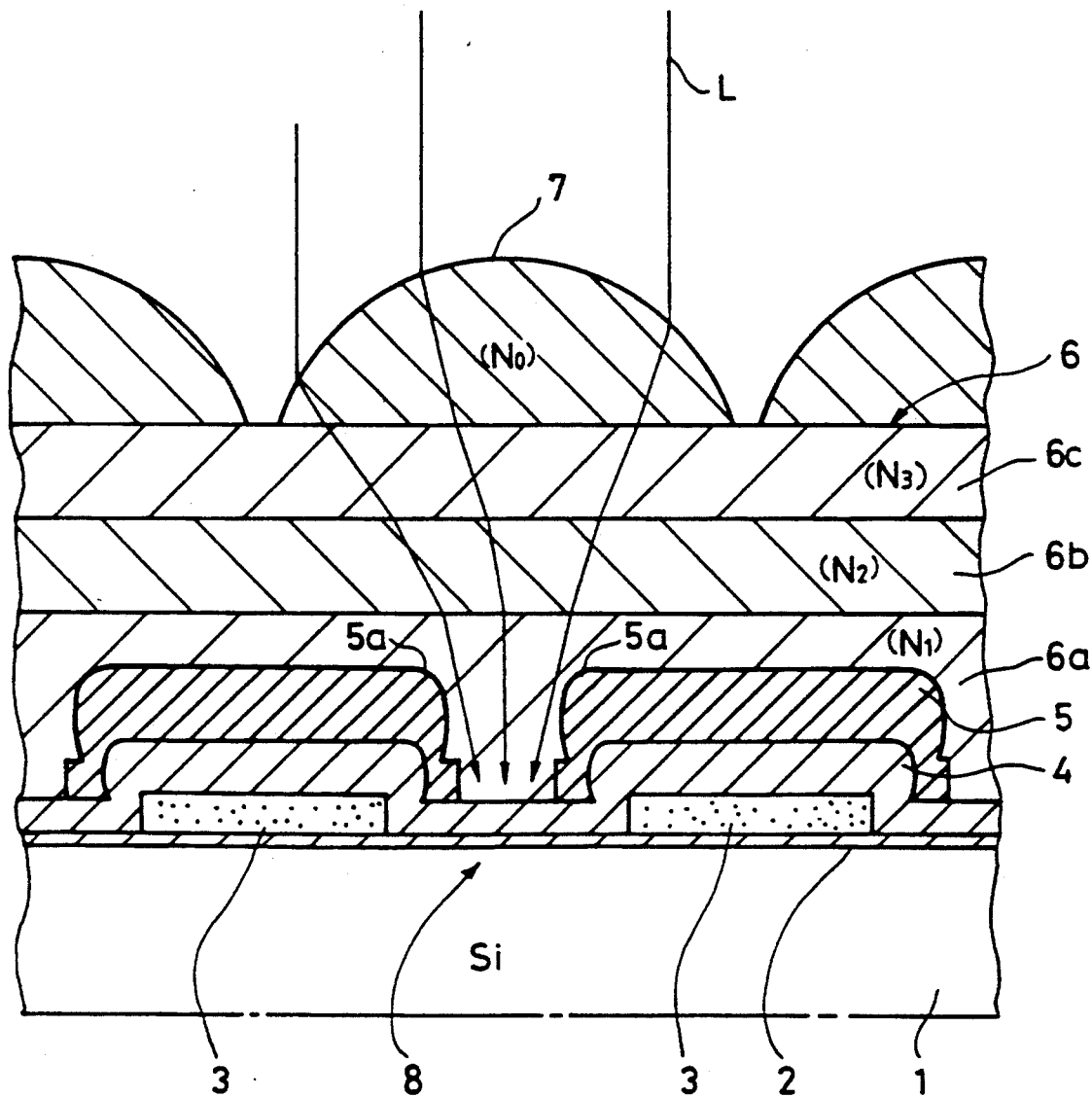
FIG. 3 is a schematic diagram showing a main portion of a second embodiment of the CCD solid state imager according to the present invention.

FIG. 2 shows a schematic diagram of a main portion of a first embodiment of the CCD solid state imager according to the present invention.

As shown in FIG. 2, in this CCD solid state imager, transfer electrodes 3, each formed of a polycrystalline silicon layer, are selectively formed on a silicon substrate 1 through a gate insulating layer 2 made of $SiO_2$ or the like. Al light-shielding layers 5 are selectively formed on these transfer electrodes 3 through an interlayer 4 and a flattened layer 6 is laminated on the whole surface involving the Al light-shielding layers 5. Then, a micro-condenser lens 7 is formed on the flattened layer 6.

In this embodiment, the above-mentioned flattened layer 6 is formed by sequentially laminating a first layer 6a made of an SiN layer (P-SiN layer) formed by a plasma CVD (chemical vapor deposition) method or an $SiO_2$ layer formed by a thermal CVD method and a second layer 6b made of a resin layer having a refractive index $N_2$ lower than a refractive index $N_1$ of the first layer 6a ($N_2 < N_1$).

A portion in which the above transfer electrodes 3 are not formed is a light sensitive portion 8, and the Al light-shielding layers 5 on this light sensitive portion 8 are removed. Further, the above condenser lens 7 is formed on the flattened layer 6 in correspondence with the light sensitive portion 8. Furthermore, in this embodiment, a thickness from the surface of the substrate 1 to the upper surface of the Al light-shielding layer 5 is in a range of from about 2.5 to 3.0 $\mu m$, a thickness of the first layer 6a is about 2 $\mu m$ and a thickness of the second layer 6b is 2 $\mu m$ or more. In addition, the relationship between the refractive index $N_0$ of the condenser lens 7 and the refractive index $N_2$ of the second layer 6b is selected as $N_2 < N_0$ in this embodiment.

As described above, according to this embodiment, since the flattened layer 6 formed between the condenser lens 7 and the Al light-shielding layer 5 is formed as a bilayer by sequentially laminating the first layer 6a and the second layer 6b having the refractive index $N_2$ lower than the refractive index $N_1$ of the first layer 6a, a light L incident on the condenser lens 7 is refracted by its lower layer or by the second under layer 6b and the first layer 6a sequentially, in that order and finally becomes incident on the light sensitive portion 8 on the substrate 1 substantially perpendicularly thereto. As a consequence, of the incident light L being converged by the condenser lens 7, the light component shielded by a shoulder portion 5a of the Al light-shielding layer 5 is reduced and therefore a sensitivity increasing effect, which is the effect inherent in the condenser lens, can be sufficiently demonstrated, which can make the CCD solid state imager compact in size and which can also improve the image quality. In particular, if the relationship between the refractive index $N_0$ of the condenser lens 7 and the refractive index $N_2$ of the second layer 6b is expressed as the inequality of $N_0 < N_2$ as in this embodiment, then the above-mentioned sensitivity increasing effect can be achieved more efficiently. Further, according to the present invention, the peripheral depreciation of light which passes through the camera lens can be prevented.

While the flattened layer 6 formed between the condenser lens (refractive index $N_0$) 7 and the Al light-shielding layer 5 is formed by sequentially laminating the two layers having different refractive indexes, that is, the first layer (refractive index $N_1$) 6a and the second layer (refractive index $N_2$) 6b in the first embodiment, the present invention is not limited thereto and the following variant is also possible. That is, as shown in FIG. 3, the flattened layer 6 formed between the condenser lens 7 and the Al light-shielding layer 5 may be formed by sequentially laminating three layers having different refractive indexes, that is, the first layer (refractive index $N_1$) 6a, the second layer (resin layer: refractive index $N_2$) 6b and a third layer (resin layer: refractive index $N_3$). In this case, the respective refractive indexes $N_0$, $N_1$, $N_2$ and $N_3$ are selected so as to satisfy the condition of $N_1 > N_2 > N_3$. In this case, relationship between the refractive index $N_0$ of the condenser lens 7 and the refractive index $N_3$ of the third layer 6c is selected so as to satisfy the condition of $N_3 < N_0$.

Alternatively, the flattened layer 6 may be formed by sequentially laminating four layers or more. In this case, the refractive indexes of the respective layers are sequentially increased to the first layer.

According to the CCD solid state imager of the present invention, of the incident light converged by the condenser lens, the light component shielded by the shoulder portion of the Al light-shielding layer is reduced and the sensitivity increasing effect, which is the effect inherent in the condenser lens, can be demonstrated sufficiently. Thus, the CCD solid state imager can be made compact in size and the image quality can be improved.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims

What is claimed is:

1. A CCD solid state imager comprising,
   a light sensitive portion,
   a pair of light shielding members mounted on either side of said light sensitive portion,
   a first transparent layer with one non-planar surface in contact with said pair of light shielding members and over said light sensitive portion and a second surface of said first transparent layer which is planar, and
   a second transparent layer with a first planar surface in contact with said second planar surface of said first transparent layer, a condenser lens in contact with a second planar surface of said second transparent layer, and a refractive index of said condenser lens being greater than a refractive index of said second transparent layer, and said refractive index of said second transparent layer being lower than a refractive index of said first transparent layer, wherein said second surface of said first transparent layer is located over the surface of said light shielding members.

2. A CCD solid state imager comprising, a light sensitive portion, a pair of light shielding members mounted on either side of said light sensitive portion, a transparent multi-layer with a bottom layer which has a first non-planar surface in contact with said pair of light shielding members and over said light sensitive portion, and a plurality of planar layers stacked over a second planar surface of said bottom layer, a condenser lens mounted on a top surface of the uppermost layer of said plurality of planar layers, and a refractive index of said condenser lens being greater than a refractive index of said uppermost planar layer, and refractive indexes of each of said planar layers each having a refractive index which is less than any of the layers below it, and a refractive index of said bottom layer being greater than the refractive indexes of any of said plurality of planar layers.

3. A CCD solid state imager according to claim 1, wherein said first layer being formed of an SiN layer or $SiO_2$ layer and said second layer being formed of a resin layer.

* * * * *